United States Patent [19]

Stitt

[11] Patent Number: 4,467,286

[45] Date of Patent: Aug. 21, 1984

[54] RESISTOR LADDER NETWORK

[75] Inventor: Robert M. Stitt, Tucson, Ariz.

[73] Assignee: Burr-Brown Corporation, Tucson, Ariz.

[21] Appl. No.: 439,944

[22] Filed: Nov. 8, 1982

[51] Int. Cl.³ .............................................. H03G 3/02
[52] U.S. Cl. ...................................... 330/86; 330/84; 333/81 R
[58] Field of Search ................... 330/84, 86, 144, 282, 330/286; 333/81 R

[56] References Cited

U.S. PATENT DOCUMENTS 3,590,366  6/1971  Vaughn ........................ 333/81 R X
3,858,128 12/1974  Mullin ............................ 333/81 R
4,354,159 10/1982  Schorr et al. ................. 333/81 R X Primary Examiner—James B. Mullins
Assistant Examiner—Steven J. Mottola
Attorney, Agent, or Firm—Harry M. Weiss

[57] ABSTRACT

A ladder network includes a plurality of cascaded prototype network sections connection in cascade and terminated with a termination resistor. The sections each provide gains of ½, 2/5, 1/5 and 1/10. Linear circuits are also disclosed which utilize at least one amplifier and the ladder network in a feedback loop.

26 Claims, 6 Drawing Figures

RESISTOR LADDER NETWORK

BACKGROUND OF THE INVENTION

1. Field of the Invention

This invention relates generally to electronics and more specifically to a resistor ladder network.

2. Description of the Prior Art

The most critical element of a successive approximation type of analog-to-digital converter is usually a resistor ladder network. The resistor ladder network may additionally be used as a feedback element of an operational amplifier to construct an amplifier with a selectable gain.

Most often, the resistor ladder network is what is known as an R-2R ladder network. The R-2R ladder is typically comprised of a plurality of cascaded prototype resistance divider networks terminated by a termination resistor.

The prototype divider is comprised of two resistors. A first resistor of a known value is connected between the input and the output of the prototype divider. A second resistor of twice the known value is connected from the output of the prototype divider to a common terminal-typically ground.

The termination resistor is twice the known value. When, for example, one volt is applied to the input of an R-2R network that includes four of the dividers terminated by the termination resistor, the dividers respectively provide ½ volt, ¼ volt, ⅛ volt and 1/16 volt.

The R-2R ladder has desired characteristics when fabricated from resistors of one temperature coefficient. Moreover, the R-2R ladder is preferably made from resistors in a precise one-to-one and two-to-one ratio; resistance values are of second order importance.

Typically, the R-2R network is packaged as an integrated circuit of either thick or thin film, or monolithic construction. Moreover, the packaged circuit is fabricated from resistors all of substantially the known value and one temperature coefficient. When a resistance of twice the known value is desired, two resistors of the known value are connected in series. Resistors of substantially one value and temperature coefficient are readily provided through well known fabrication techniques of integrated circuits. Moreover, the fabrication techniques are advantageously used by fabricating the packaged network from resistors of substantially one value.

The R-2R network is one of few known resistor ladder networks that is practical to fabricate from resistors of substantially one value. Because of the fabrication techniques of integrated circuits, there is a need for the other resistance ladder networks that are practical to fabricate from resistors of one value.

SUMMARY OF THE INVENTION

An object of the present invention is an easily constructed network useable as a precision attenuator.

Another object of this invention is a resistor ladder network that provides attenuations other than those provided by conventional R-2R ladder networks.

According to the present invention, a cascadable prototype network section of a ladder network provides gains of ½, 2/5, 1/5, and 1/10 when said ladder network is terminated by a termination resistor.

The invention provides a cascadable prototype network section that is practical to fabricate from resistors of substantially one value.

The foregoing and other objects, features and advantages of the invention will be apparent from the following more particular description of the invention, as illustrated in the accompanying drawing.

DESCRIPTION OF THE PREFERRED EMBODIMENT

Figure 1:
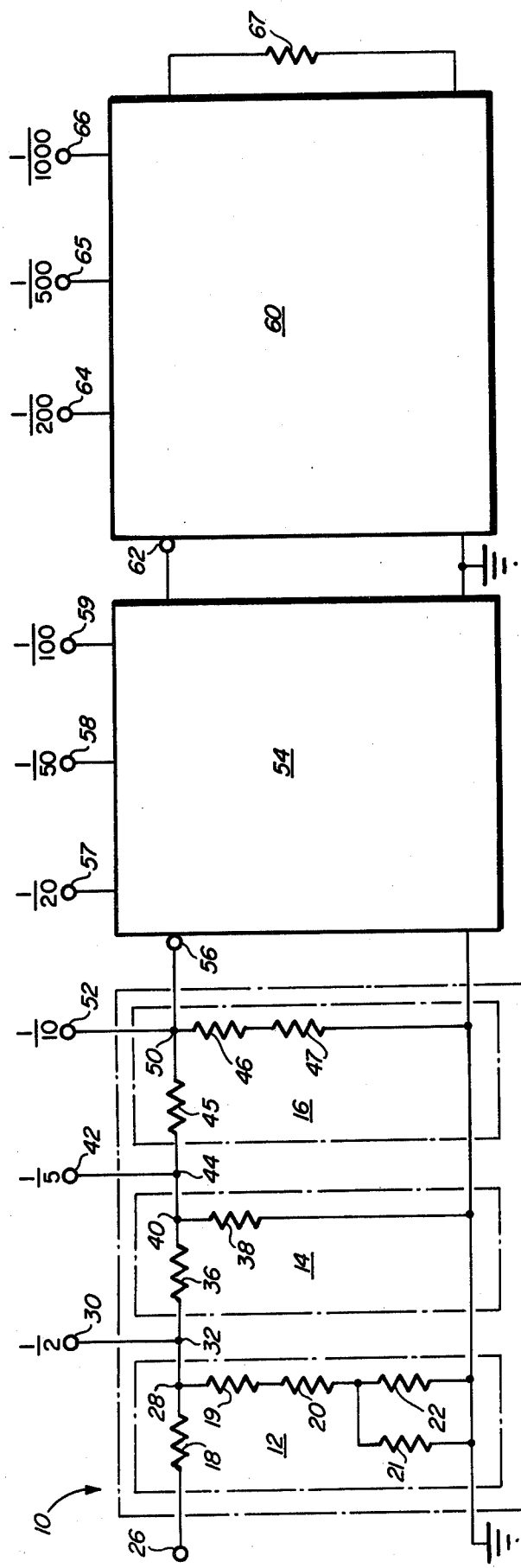
FIG. 1 is a schematic block diagram of a first embodiment of the present invention.

As shown in FIG. 1, in a first embodiment of the present invention a prototype network section 10 of a ladder network includes voltage dividers 12, 14, 16 all connected in cascade. Moreover, the voltage dividers 12, 14, 16 are comprised of resistors of substantially one value.

The voltage divider 12 is comprised of resistors 18, 19, 20 all connected in series with a parallel combination of resistors 21, 22. One end of the resistor 18 is connected to an input terminal 26 of the section 10. One end of the parallel combination of resistors 21, 22 is connected to ground.

The divider 12 has an output 28 at the junction of the resistors 18, 19 which is connected to an attenuation terminal 30 and to an input terminal 32 of the divider 14. In response to a known voltage being applied to the input terminal 26, one half of the known voltage is provided at the terminals 30, 32.

The divider 14 is comprised of resistors 36, 38 connected in series between the input terminal 32 and ground. The divider 14 has an output 40 at the junction of resistors 36, 38 which is connected to an attenuation terminal 42 and an input terminal 44 of the divider 16. In response to the known voltage being applied to the terminal 26, one fifth of the known voltage is provided at the terminals 42, 44.

The divider 16 includes resistors 45-47 connected in series between the input terminal 44 and ground. More particularly, one end of the resistor 45 is connected to the input terminal 44 and one end of the resistor 47 is connected to ground. The divider 16 has an output terminal 50 at the junction of the resistors 45, 46 which is connected to an attenuation terminal 52 and to a prototype network section 54, similar to the section 10, at an input terminal 56 thereof. In response to the known voltage being applied to the terminal 26, one tenth of the known voltage is provided at the terminals 52, 56.

The section 54 has attenuation terminals 57-59 that correspond to the terminals 30, 42, 52, respectively. In response to the application of the known voltage to the terminal 26, 1/20, 1/50 and 1/100 of the known voltage is provided at the terminals 57-59, respectively. Accordingly, the section 54 also provides gains of ½, 1/5 and 1/10.

The section 54 has an output, similar to the output of the section 10, connected to a prototype network section 60 at an input terminal 62 thereof. The section 60 has attenuation terminals 64–66 that correspond to the terminals, 30, 42, 52, respectively. Additionally, the section 60 has an output, similar to the outputs of the sections 10, 54, but connected to a termination resistor 67 that has twice the resistance of each of the other resistors of the ladder network. In response to the application of the known voltage to the terminal 26, 1/200, 1/500 and 1/1000 of the known voltage is provided at the terminals 64–66, respectively. Accordingly, the section 60 provides gains of ½, 1/5 and 1/10.

Because all of the resistors of the ladder network are linear, passive components, the ladder network is useable to attenuate a signal applied to any of the attenuation terminals 30, 42, 52, 57–59, 64, 65. When, for example, the known voltage is applied to the terminal 42, one half of the known voltage is provided at the terminals 50, 52. When the known voltage is applied at the terminal 30, two fifths and one fifth of the known voltage is provided at the terminals 42, 52, respectively.

Thus, there is described hereinbefore, a cascadable prototype network section for providing gains of ½, 2/5, 1/5 and 1/10. As explained hereinafter, the network section is useable as an element of an amplifier having a selectable gain.

Figure 2:
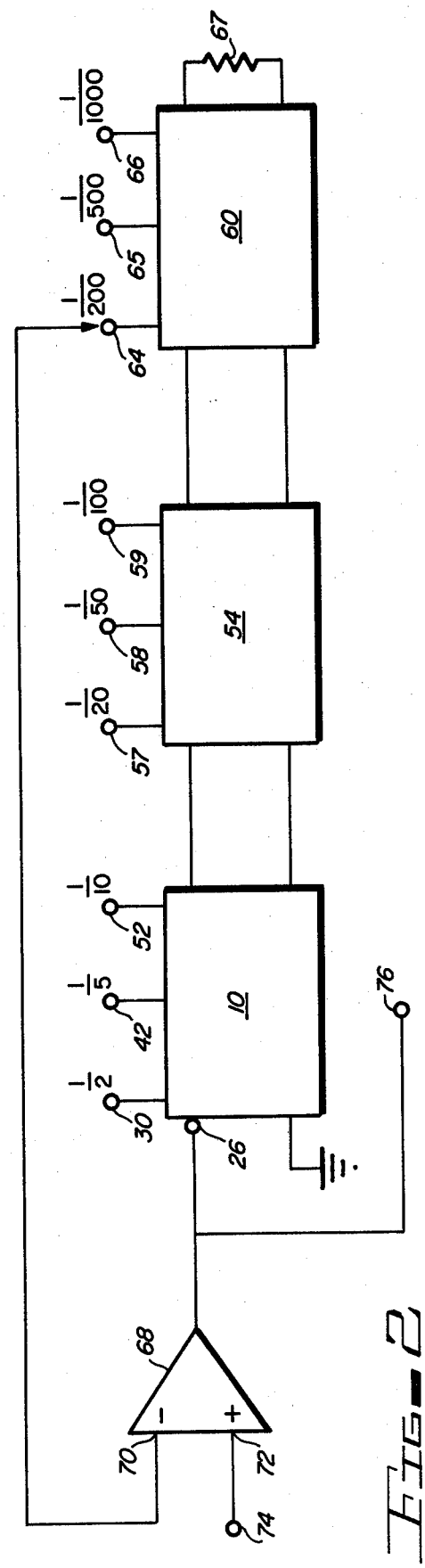
FIG. 2 is a schematic block diagram of an amplifier having a selectable gain using the network invention disclosed in FIG. 1.

As shown in FIG. 2, an operational amplifier 68 of any suitable type has an inverting input 70 and a non-inverting input 72 connected to the terminal 64 and an input terminal 74, respectively. Additionally, the output of the amplifier 68 is connected to the terminal 26 and an output terminal 76, whereby the sections 10, 54, 60 form a feedback loop.

In accordance with well known feedback amplifier theory, in response to the known voltage being applied to the terminal 74, a feedback voltage, substantially equal to the known voltage, is provided to the inverting input 70 via the sections 10, 54, 60. Accordingly, the voltage at the terminal 64 is substantially equal to the known voltage and, from the explanation given hereinbefore, is 1/200 of the voltage provided at the terminal 26 by the amplifier 68. Therefore, a voltage amplification of 200 times the known voltage is provided at the terminal 76. In a similar manner, other voltage amplifications are attainable.

Figure 3:
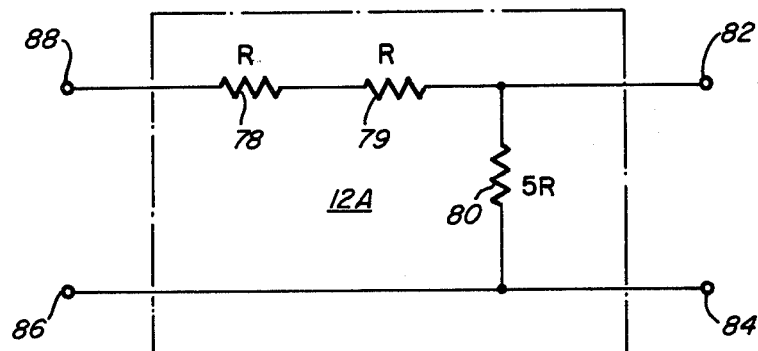
FIG. 3 is a schematic diagram of a divider network.

Referring to FIG. 3 a voltage divider 12A, shown for tutorial purposes, is comprised of resistors 78, 79, 80, all connected in series, with the ends of the resistor 79 connected respectively to ends of the resistors 78, 80. Moreover, the resistors 78–80 have normalized resistances of R, R and 5R, respectively. The ends of the resistor 80 are connected to output terminals 82, 84, respectively. Moreover, the end of resistor 80 which is connected to the terminal 84, is additionally connected to an input terminal 86, whereby the terminals 84, 86 are connected together (similar to the ground connection of the section 10). An input terminal 88 is connected to the resistor 78.

In comparing the dividers 12 (of FIG. 1) and 12A (of FIG. 3), it should be understood that when the resistor 18 (FIG. 1) has the normalized resistance 2R, it is equal in resistance to the series combination of the resistors 78, 79 (of FIG. 3). Similarly, when the resistors 19–22 (of FIG. 1) each have the normalized resistance, 2R, they combine to provide a normalized resistance of 5R. Therefore, the divider 12A has similar transfer characteristics to the divider 12. When, for example, the divider 12A is used in an exemplary prototype network section (similar to the section 10) in place of the divider 12 and all other resistors of the exemplary network have the normalized resistance, 2R, the gains of ½, 2/5, 1/5 and 1/10 are provided as described hereinbefore.

Figure 4:
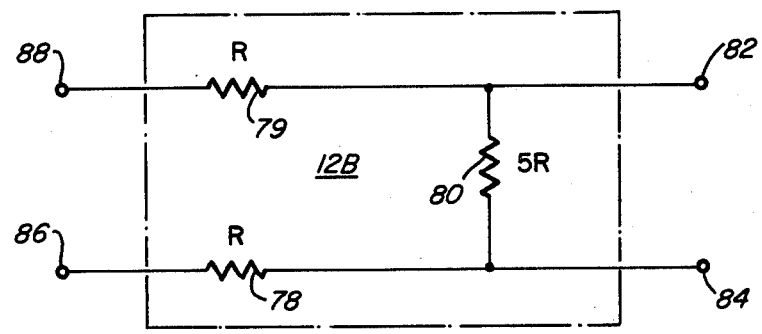
FIG. 4 is a schematic diagram of a balanced four terminal divider network.

As shown in FIG. 4, a voltage divider 12B includes the resistors 78–80 connected in series, but in a different configuration, with the ends of the resistor 80 respectively connected to ends of the resistors 78, 79. Unlike the divider 12A, the terminals 84, 86 are not directly connected together. However, like the divider 12A, a signal applied to the input terminals 88, 86, is applied across the series combination of resistors 78–80. Additionally, the output terminals 82, 84 are connected across the resistor 80. Therefore the dividers 12A and 12B, which are both variations of the divider 12, have transfer characteristics similar to the transfer characteristics of the divider 12.

An important aspect of the divider 12B is that the resistance between the terminals 82, 88 substantially equals the resistance between the terminals 84, 86. Moreover, the resistance between the terminals 84, 88 substantially equals the resistance between the terminals 82, 86. Therefore, the divider 12B is a balanced four terminal network. As explained hereinafter, the divider 12B is useful in the construction of a difference amplifier having a selectable gain.

Figure 5:
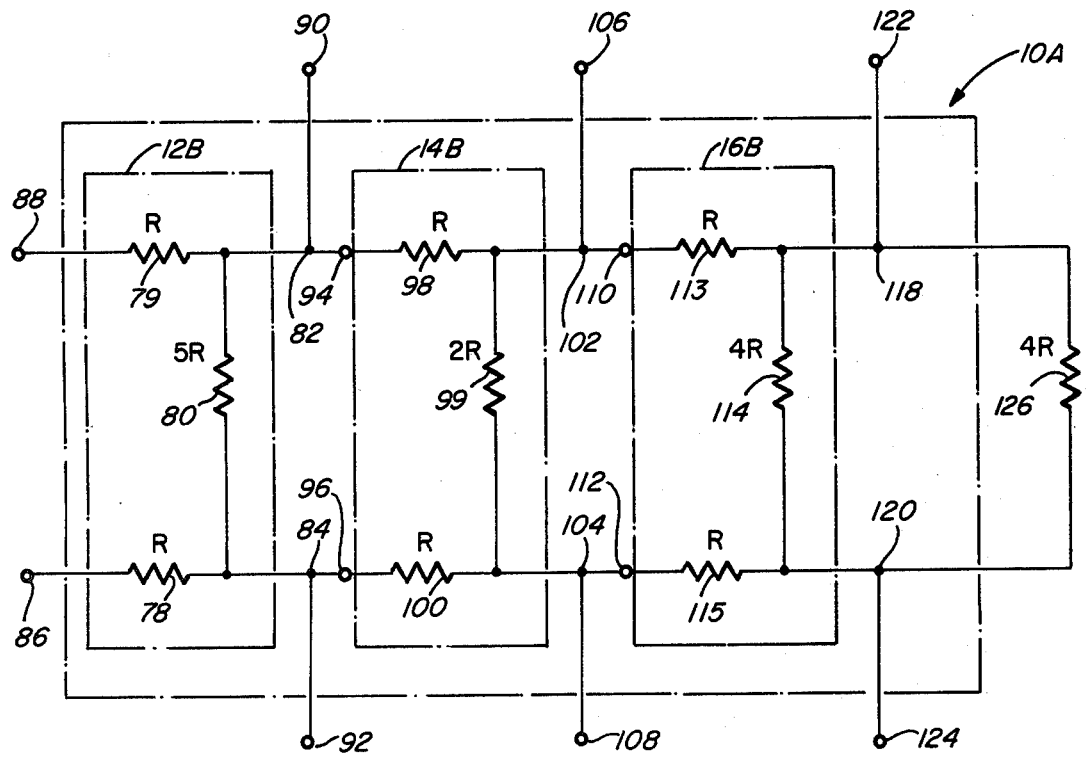
FIG. 5 is a schematic diagram of a second embodiment of the present invention.

Referring to FIG. 5, in a second embodiment of the present invention, a prototype network section 10A includes the divider 12B of FIG. 4 connected in cascade with voltage dividers 14B, 16B. As explained hereinafter, the dividers 14B, 16B are both balanced four terminal networks that have transfer characteristics similar to the dividers 14, 16, respectively of FIG. 1.

The terminals 82, 84 are respectively connected to attenuation terminals 90, 92 and to input terminals 94, 96 of the divider 14B. In response to the known voltage being applied to the input terminals 88, 86, one half of the known voltage is provided between the terminals 90, 92 and between the terminals 94, 96.

The divider 14B is comprised of resistors 98–100 all connected in series between the terminals 94, 96. The resistors 98, 100 both have the normalized resistance, R. The resistor 99 has the normalized resistance, 2R. The junction of the resistors 98, 99 and the junction of the resistors 99, 100 are respectively connected to output terminals 102, 104 of the divider 14B. The terminals 102, 104 are respectively connected to attenuation terminals 106, 108 and input terminals 110, 112 of the divider 16B.

The divider 14B is derived from the divider 14 in a manner similar to the derivation of the divider 12B from the divider 12. Therefore, the divider 14B is a balanced four terminal network that has transfer characteristics similar to the transfer characteristics of the divider 14. Accordingly, in response to the known voltage being applied to the terminals 88, 86, one fifth of the known voltage is provided between the terminals 106, 108 and between the terminals 110, 112.

The divider 16B is comprised of resistors 113–115 all connected in series between the terminals 110 112. The resistors 113, 115 both have the normalized resistance, R. The resistor 114 has the normalized resistance, 4R. The junctions of the resistors 113, 114 and the junctions of the resistors 114, 115 are respectively connected to the output terminals 118, 120 of the divider 16B. The terminals 118, 120 are respectively connected to attenuation terminals 122, 124 and to ends of a termination resistor 126 that has a normalized resistance, 4R.

The divider 16B is derived from the divider 16 in a manner similar to the derivation of the divider 12B from the divider 12. Therefore, the divider 16B is a balanced four terminal network that has transfer characteristics similar to the transfer characteristics of the divider 16. Accordingly, in response to the known voltage being applied to the terminals 88, 86, one tenth of the known voltage is provided between the terminals 122, 124 and across the termination resistor 126.

Additionally, since the section 10A is comprised of cascaded, balanced four terminal networks, the section 10A is a balanced four terminal network. It should be understood that the section 10A may be constructed from resistors of one value where, for example, the resistor 80 is made from five resistors connected in series, since it has the normalized resistance, 5R. Other resistors of the section 10A are made in a similar manner.

Like the section 10, the known voltage may be alternatively applied to the terminals 90, 92 or the terminals 106, 108. When, for example, the known voltage is applied to the terminals 90, 92, two fifths and one fifth of the known voltage is provided between the terminals 106, 108 and between the terminals 122, 124, respectively.

Figure 6:
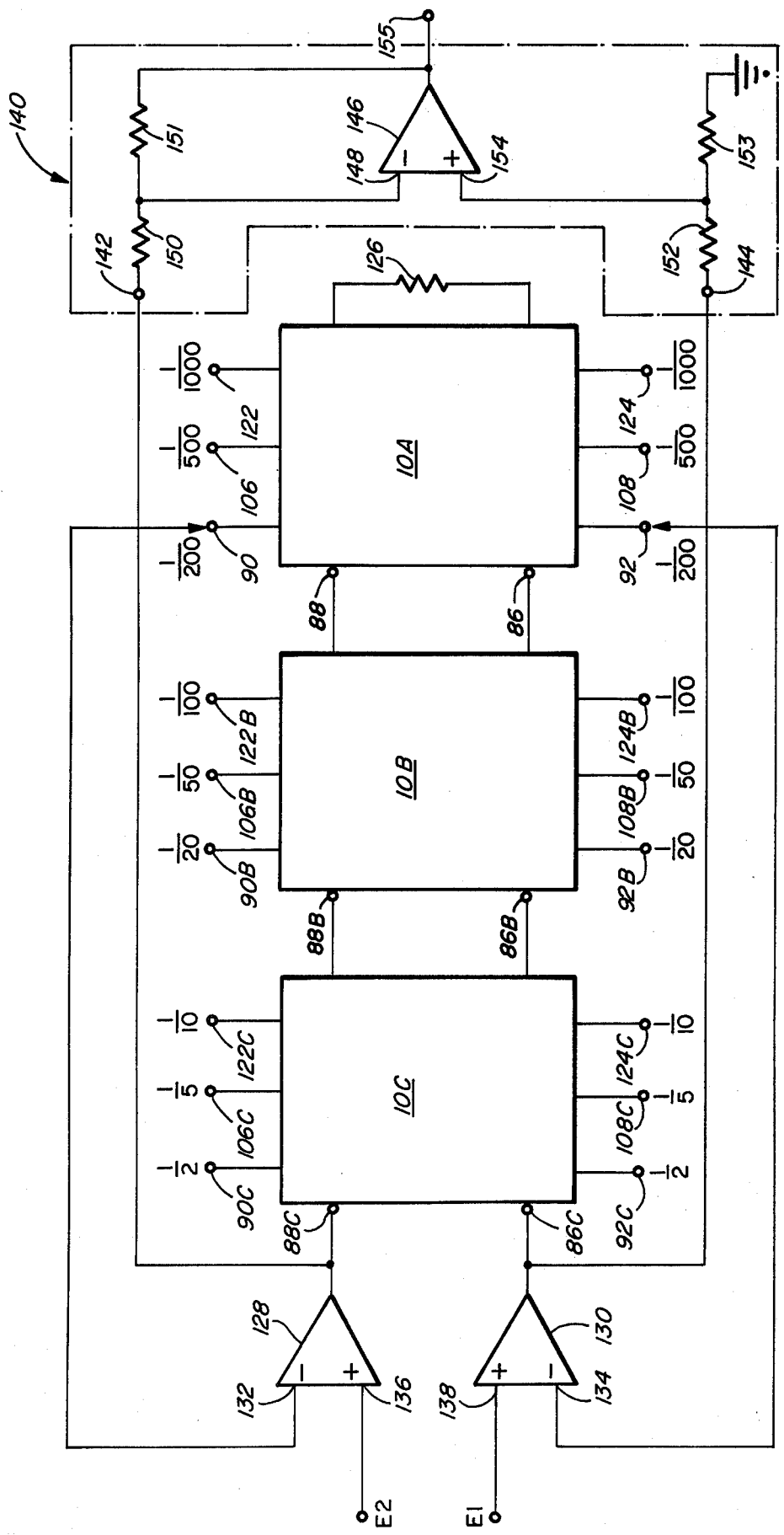
FIG. 6 is a schematic block diagram of a difference amplifier with a selectable gain.

As shown in FIG. 6, a difference amplifier of a type useful in instrumentation applications, includes the section 10A and prototype network sections 10B, 10C, similar to the section 10A, all connected in cascade. More particularly, the terminals 88, 86 are connected to the output of the section 10B. Additionally, the section 10B has input terminals 88B, 86B, similar to the terminals 88, 86, connected to the output of the section 10C.

The section 10C has input terminals 88C, 86C, respectively connected to the outputs of operational amplifiers 128, 130, both similar to the amplifier 68 of FIG. 2. The terminals 88C, 86C are similar to the terminals 88, 86, respectively.

The inverting input 132 of the amplifier 128 is connected to the terminal 90. Correspondingly, the inverting input 134 of the amplifier 130 is connected to the terminal 92. Accordingly, the sections 10A, 10B, 10C form a feedback loop for the amplifiers 128, 130.

A voltage, E2, is applied to the non-inverting input 136 of the amplifier 128. Correspondingly, a voltage, E1, is applied to the non-inverting input 138 of the amplifier 130. As explained hereinafter, the difference amplifier provides a selectable amplification of the difference between the voltages, E1 and E2.

In accordance with well known feedback amplifier theory, in response to the application of the voltages, E1 and E2, feedback voltages, substantially equal to the voltages, E1 and E2, are respectively provided to the inputs 134, 132 via the sections 10A, 10B, 10C. Accordingly, the voltages at the terminals 90, 92 are substantially equal to the voltages, E2 and E1, respectively, and, from the explanation given hereinbefore, are 1/200 of the voltages provided at the terminals 88C, 86C by the amplifiers 128, 130. Therefore, a voltage amplification of 200 is provided at the outputs of the amplifiers 128, 130. Hence, voltages of 100.5E2 −99.5E1 and 100.5E1 −99.5E2 are provided at the outputs of the amplifiers 128, 130, respectively. Correspondingly, other amplifications are attainable by connections of the outputs of the amplifiers 128, 130 to suitable attenuation terminals of the sections 10A–10C.

The difference between the voltages, 100.5E2 −99.5E1 and 100.5E1 −99.5E2, is obtained by connecting the outputs of the amplifiers 128, 130 to a substraction network 140 at input terminals 142, 144 thereof, respectively. The terminal 142 is connected to an operational amplifier 146 at the inverting input 148 thereof through a resistor 150. Additionally, the input 148 is connected to the output of the amplifier 146 through a resistor 151.

The terminal 144 is connected to ground through resistors 152, 153, which are connected in series. The junction of the resistors 152, 153 is connected to the non-inverting input 154 of the amplifier 146. The resistors 150–153 are of substantially equal resistance.

The subtraction network 140 is of a well known type. In response to voltages provided at the terminals 144, 142, the amplifier provides a voltage substantially equal to the difference therebetween at a terminal 155 connected to the output of the amplifier 146. Therefore, the subtraction network 140 provides a difference voltage substantially equal to 200 (E1–E2) volts.

While the invention has been particularly shown and described with reference to a preferred embodiment thereof, it should be understood by those skilled in the art that changes in the form and detail thereof may be made therein without departing from the spirit and the scope of the invention.

What is claimed is:

1. A cascadable prototype network section selectively adapted for a termination by a termination resistor and for connection in cascade with at least one other cascadable prototype network section terminated by said termination resistor, comprising:
   first attenuation means for providing one half of a voltage applied to said network section;
   second attenuation means, connected to said first means, for providing one fifth of said voltage; and
   third attenuation means, connected to said second means, for providing one tenth of said voltage, said first second and third means are made from resistors of substantially one value, and said first means is comprised of three resistors connected in series with a parallel combination of two resistors.

2. The prototype network section of claim 1 wherein said second means comprises a pair of resistors connected in series.

3. The prototype network section of claim 1 wherein said second means comprises a pair of resistors connected in series.

4. The prototype network section of claim 1 wherein said third means comprises three resistors connected in series.

5. The prototype network section of claim 2 wherein said third means comprises three resistors connected in series.

6. The prototype network section of claim 4 wherein said first means comprises three resistors connected in series with a parallel combination of two resistors.

7. The prototype network section of claim 6 wherein said second means comprises a pair of resistors connected in series.

8. The prototype network section of claim 1 wherein said second and third means provide two fifths and one fifth, respectively, of a voltage applied to said second means.

9. The prototype network section of claim 1 wherein said third means provides one half of a voltage applied at an input thereof.

10. The prototype network section of claim 1 wherein said first, second and third means are balanced four terminal networks.

11. The prototype network section of claim 10 wherein said first, second and third means are made from resistors of substantially one value.

12. The prototype network section of claim 10 wherein said first means comprises several resistors having an equivalent value of seven resistors, each of substantially one value, connected in series.

13. The prototype network section of claim 10 wherein said second means comprises several resistors having an equivalent value of four resistors, each of substantially one value, connected in series.

14. The prototype network section of claim 10 wherein said third means comprises several resistors having an equivalent value of six resistors, each of substantially one value, connected in series.

15. The prototype network section of claim 12 wherein said second means comprises several resistors having an equivalent value of four resistors, each of substantially one value, connected in series.

16. The prototype network section of claim 13 wherein said third means comprises several resistors having an equivalent value of six resistors, each of substantially one value, connected in series.

17. The prototype network section of claim 14 wherein said first means comprises several resistors having an equivalent value of seven resistors, each of substantially one value, connected in series.

18. The prototype network section of claim 10 wherein said second and third means provide two fifths and one fifth, respectively, of a voltage applied to said second means.

19. The prototype network section of claim 10 wherein said third means provides one half of a voltage applied at an input thereof.

20. An amplifier electronic circuit wherein an amplifier is coupled to a resistance ladder network that includes a resistance ladder prototype network section, said prototype network section comprising:
   first attenuation means for providing one half of an input voltage applied to said resistance ladder network;
   second attenuation means for providing one fifth of said input voltage, the input of said second means being connected to the output of said first means;
   third attenuation means for providing one tenth of said input voltage, the input of said third means being connected to the output of said second means;
   said prototype network section is comprised of resistors of substantially one value; and
   said first means comprises three resistors connected in series with a parallel combination of two resistors.

21. The electronic circuit of claim 20 wherein said second means comprises a pair of resistors connected in series.

22. The electronic circuit of claim 20 wherein said third means comprises three resistors connected in series.

23. An amplifier electronic circuit wherein an amplifier is coupled to a resistance ladder network that includes a resistance ladder prototype network section, said prototype network section comprising:
   first attenuation means for providing one half of an input voltage applied to said resistance ladder network;
   second attenuation means for providing one fifth of said input voltage, the input of said second means being connected to the output of said first means;
   third attenuation means for providing one tenth of said input voltage, the input of said third means being connected to the output of said second means;
   said prototype network section is comprised of resistors of substantially one value;
   said prototype network section is a balanced four terminal network; and
   said prototype network section is comprised of resistors of substantially one value.

24. The electronic circuit of claim 23 wherein said first means comprises several resistors having an equivalent value of seven resistors, each of substantially one value, connected in series.

25. The electronic circuit of claim 23 wherein said second means comprises several resistors having an equivalent value of four resistors, each of substantially one value, connected in series.

26. The electronic circuit of claim 23 wherein said third means comprises several resistors having an equivalent value of six resistors, each of substantially one value, connected in series.

* * * * *